(12) United States Patent
Cao et al.

(10) Patent No.: US 11,094,898 B2
(45) Date of Patent: Aug. 17, 2021

(54) SUPPORTING STRUCTURE AND DISPLAY DEVICE

(71) Applicant: BOE TECHNOLOGY GROUP CO., LTD., Beijing (CN)

(72) Inventors: Fangxu Cao, Beijing (CN); Haoran Wang, Beijing (CN); Liming Dong, Beijing (CN); Yonghong Zhou, Beijing (CN); Dengyu Wang, Beijing (CN); Zhenhua Zhang, Beijing (CN); Benlian Wang, Beijing (CN); Weinan Dai, Beijing (CN); Xucong Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/822,585

(22) Filed: Mar. 18, 2020

(65) Prior Publication Data

US 2021/0151697 A1     May 20, 2021

(30) Foreign Application Priority Data

Nov. 20, 2019   (CN) .......................... 201911138068.5

(51) Int. Cl.
  *H01L 51/00* (2006.01)
  *H01L 51/56* (2006.01)
  *H05K 5/00* (2006.01)

(52) U.S. Cl.
  CPC .......... *H01L 51/0097* (2013.01); *H01L 51/56* (2013.01); *H05K 5/0017* (2013.01); *H01L 2251/5338* (2013.01)

(58) Field of Classification Search
  CPC ................ H01L 51/0097; H01L 51/56; H01L 2251/5338; H05K 5/0017
  See application file for complete search history.

(56) References Cited

U.S. PATENT DOCUMENTS

| | | | | |
|---|---|---|---|---|
| 10,186,648 | B2* | 1/2019 | Kim | .................... H01L 25/0753 |
| 10,466,746 | B2* | 11/2019 | Hong | .................. H01L 51/5246 |
| 2008/0218369 | A1* | 9/2008 | Krans | ................. H01L 51/0097 |
| | | | | 340/691.1 |
| 2010/0009120 | A1* | 1/2010 | Boyce | .................... B32B 3/266 |
| | | | | 428/134 |

(Continued)

*Primary Examiner* — Abhishek M Rathod
(74) *Attorney, Agent, or Firm* — Thomas | Horstemeyer, LLP

(57) ABSTRACT

This disclosure provides a supporting structure disposed at a side of the flexible display panel and at least including a first bendable region, and a display device. A bending axis corresponding to the first bendable region extends in a first direction. The first bendable region has a plurality of first primary bending regions and a plurality of first deformation compensation regions alternately arranged in the first direction. The first primary bending region includes a plurality of first primary strip-shaped holes arranged in an array, and the first primary strip-shaped holes extend in the first direction. The first deformation compensation region includes a plurality of groups of first hollowed-out patterns arranged in an array. Each group of first hollowed-out patterns is formed by combining a plurality of hollowed-out holes, and at least two of the plurality of hollowed-out holes are different in a shape or an extending direction.

15 Claims, 5 Drawing Sheets

(56) References Cited

U.S. PATENT DOCUMENTS

| | | | |
|---|---|---|---|
| 2016/0357052 A1* | 12/2016 | Kim | H01L 51/5237 |
| 2017/0092884 A1* | 3/2017 | Zhang | G06F 3/0412 |
| 2018/0108861 A1* | 4/2018 | Kinoshita | H01L 51/0097 |
| 2018/0190936 A1* | 7/2018 | Lee | B32B 3/30 |
| 2018/0309088 A1* | 10/2018 | Gong | H01L 51/5253 |
| 2019/0130796 A1* | 5/2019 | Kang | H01L 51/0097 |
| 2019/0132947 A1* | 5/2019 | Koo | H05K 1/0281 |
| 2019/0143631 A1* | 5/2019 | Zhang | B32B 3/266 |
| | | | 428/138 |
| 2019/0171057 A1* | 6/2019 | Kim | H01L 51/0097 |

* cited by examiner

SUPPORTING STRUCTURE AND DISPLAY DEVICE

CROSS-REFERENCE TO RELATED APPLICATION

This application is based on, and claims the benefit of and priority to, Chinese Patent Application No. 201911138068.5, filed on Nov. 20, 2019, where the entire contents of which are incorporated herein by reference.

TECHNICAL FIELD

This application relates to the field of display technologies and, in particular, to a supporting structure and a display device.

BACKGROUND

With the development of display technologies, flexible display panels that can be folded, stretched, curled, or the like are gradually increasing in the market. In order to facilitate bending or restoration of flexible display panels, it is necessary to make flexible display panel thinner and lighter.

However, as flexible display panels become thinner and lighter, the overall bending resistance and impact resistance worsen, and the reliability and stability of products are reduced.

It should be noted that the information disclosed in the above "Background" section is only intended to enhance understanding of the background of the present disclosure and thus, may include information that does not constitute the prior art as already known by an ordinary person skilled in the art.

SUMMARY

An objective of this disclosure is to provide a supporting structure and a display device that ensure structural stability of the supporting structure, and enhancing impact resistance and bending resistance of the flexible display panel.

The present disclosure provides a supporting structure applied to a flexible display panel. The supporting structure at least includes a first bendable region, where a bending axis corresponding to the first bendable region extends in a first direction. The first bendable region has a plurality of first primary bending regions and a plurality of first deformation compensation regions. The plurality of first primary bending regions and the plurality of first deformation compensation regions are alternately arranged in the first direction. Each of the plurality of first primary bending regions includes a plurality of first primary strip-shaped holes arranged in an array, where the first primary strip-shaped holes extend in the first direction. Each of the plurality of first deformation compensation regions includes a plurality of groups of first hollowed-out patterns arranged in an array, where each group of first hollowed-out patterns includes a plurality of hollowed-out holes. Shapes of at least two of the plurality of hollowed-out holes are different, and extending directions of at least two of the plurality of hollowed-out holes are different.

In one or more exemplary embodiments of the present disclosure, adjacent first primary strip-shaped holes of the plurality of first primary strip-shaped holes in a second direction are staggered. The second direction is orthogonal to the first direction.

In one or more exemplary embodiments of the present disclosure, the plurality of hollowed-out holes include a first hollowed-out group and a second hollowed-out group which are spaced apart in the first direction, and the first hollowed-out group and the second hollowed-out group respectively include first hollowed-out holes and second hollowed-out holes which are spaced apart in the second direction. The first hollowed-out hole and the second hollowed-out hole are both long-strip-shaped, where the first hollowed-out holes extend in the first direction and the second hollowed-out holes extend in the second direction.

In one or more exemplary embodiments of the present disclosure, the first hollowed-out holes in the first hollowed-out group and the first hollowed-out holes in the second hollowed-out group are staggered, and the second hollowed-out holes in the first hollowed-out group and the second hollowed-out holes in the second hollowed-out group are staggered; and the second hollowed-out holes in the first hollowed-out group are opposite to the first hollowed-out holes in the second hollowed-out group, and the second hollowed-out holes in the second hollowed-out group are opposite to the first hollowed-out holes in the first hollowed-out group.

In one or more exemplary embodiments of the present disclosure, a size of the first hollowed-out hole in the first direction is larger than or equal to a size of the second hollowed-out hole in the second direction.

In one or more exemplary embodiments of the present disclosure, the plurality of hollowed-out holes include a first hollowed-out group and a second hollowed-out group. The first hollowed-out group includes two first hollowed-out holes which are spaced apart and opposite to each other in the first direction, and the two first hollowed-out holes in the first hollowed-out group are symmetrically disposed with respect to a center of the first hollowed-out group. The second hollowed-out group includes two second hollowed-out holes which are spaced apart and opposite to each other in the second direction. The two second hollowed-out holes in the second hollowed-out group are symmetrically disposed with respect to a center of the second hollowed-out group. Both the center of the first hollowed-out group and the center of the second hollowed-out group are coincided with a center of the first hollowed-out pattern. The first hollowed-out hole and the second hollowed-out hole are long-strip-shaped, the first hollowed-out holes extend in the first direction, and the second hollowed-out holes extend in the second direction.

In one or more exemplary embodiments of the present disclosure, the plurality of hollowed-out holes include a third hollowed-out group and a fourth hollowed-out group. The third hollowed-out group includes two third hollowed-out holes which are spaced apart and opposite to each other in a third direction, and the two third hollowed-out holes in the third hollowed-out group are symmetrically disposed with respect to a center of the third hollowed-out group. The fourth hollowed-out group includes two fourth hollowed-out holes which are spaced apart and opposite to each other in a fourth direction. The two fourth hollowed-out holes in the fourth hollowed-out group are symmetrically disposed with respect to a center of the fourth hollowed-out group. The center of the third hollowed-out group and the center of the fourth hollowed-out group coincide with the center of the hollowed-out pattern. The third hollowed-out hole and the fourth hollowed-out hole are both long-strip-shaped, where the third hollowed-out holes extend in the third direction, and the fourth hollowed-out holes extend in the fourth direction. The third direction intersects with the first direction and the second direction, the fourth direction intersects with the first direction and the second direction, and the fourth direction is orthogonal to the third direction.

In one or more exemplary embodiments of the present disclosure, the plurality of hollowed-out holes include a third hollowed-out group and a fourth hollowed-out group which are spaced apart in a third direction, and the third hollowed-out group and the fourth hollowed-out group both include third hollowed-out holes and fourth hollowed-out holes which are spaced apart in a fourth direction. The third hollowed-out holes in the third hollowed-out group and the third hollowed-out holes in the fourth hollowed-out group are staggered, and the fourth hollowed-out holes in the third hollowed-out group and the fourth hollowed-out holes in the fourth hollowed-out group are staggered. The fourth hollowed-out holes in the third hollowed-out group are opposite to the third hollowed-out holes in the fourth hollowed-out group, and the fourth hollowed-out holes in the fourth hollowed-out group are opposite to the third hollowed-out holes in the third hollowed-out group. The third hollowed-out hole and the fourth hollowed-out hole are both long-strip-shaped. The third hollowed out holes extend in the third direction and the fourth hollowed out holes extend in the fourth direction.

In one or more exemplary embodiments of the present disclosure, the plurality of hollowed-out holes include a first hollowed-out group and a second hollowed-out group which are spaced apart in the first direction, and the first hollowed-out group and the second hollowed-out group respectively include first hollowed-out holes and second hollowed-out holes which are spaced apart in the second direction. The first hollowed-out holes in the first hollowed-out group and the first hollowed-out holes in the second hollowed-out group are staggered, and the second hollowed-out holes in the first hollowed-out group and the second hollowed-out holes in the second hollowed-out group are staggered. The second hollowed-out holes in the first hollowed-out group are opposite to the first hollowed-out holes in the second hollowed-out group, and the second hollowed-out holes in the second hollowed-out group are opposite to the first hollowed-out holes in the first hollowed-out group. The first hollowed-out holes and the second hollowed-out holes both extend in the first direction. A size of the first hollowed-out hole in the second direction gradually increases from a center of the first hollowed-out hole to an edge of the first hollowed-out hole, and a size of the second hollowed-out hole in the second direction gradually decreases from a center of the second hollowed-out hole to an edge of the second hollowed-out hole.

In one or more exemplary embodiments of the present disclosure, the first hollowed-out hole is formed by a first arc-shaped wall, a first plane wall, a second arc-shaped wall, and a second plane wall sequentially connected to each other end to end, where the first arc-shaped wall and the second arc-shaped wall are opposite to each other in the first direction and symmetrically disposed, and the first plane wall and the second plane wall are opposite to and parallel to each other in the second direction. The second hollowed-out hole is formed by a third arc-shaped wall and a fourth arc-shaped wall which are sequentially connected with each other end to end, where the third arc-shaped wall and the fourth arc-shaped wall are opposite to each other in the first direction and are symmetrically disposed. The second arc-shaped wall of the first hollowed-out hole and the third arc-shaped wall of the second hollowed-out hole in the first hollowed-out group are adjacent to each other, and have the same profile. The first arc-shaped wall of the first hollowed-out hole and the fourth arc-shaped wall of the second hollowed-out hole in the second hollowed-out group are adjacent to each other, and have the same profile.

In one or more exemplary embodiments of the present disclosure, the supporting structure further includes a second bendable region, where a bending axis corresponding to the second bendable region extends in the second direction, the second bendable region is provided with a plurality of second primary bending regions and a plurality of second deformation compensation regions, and the second primary bending regions and the second deformation compensation regions are alternately arranged in the second direction. The second primary bending region includes a plurality of second primary strip-shaped holes which are arranged in an array, where the second primary strip-shaped holes extend in the second direction. The first deformation compensation region includes a plurality of groups of second hollowed-out patterns arranged in an array, where the second hollowed-out patterns are the same as the first hollowed-out patterns.

In one or more exemplary embodiments of the present disclosure, a sum of areas of the first deformation compensation regions is smaller than a sum of areas of the first primary bending regions, and a sum of areas of the second deformation compensation regions is smaller than a sum of areas of the second primary bending regions.

The present disclosure provides a display device including a flexible display panel and a supporting structure according to any of the foregoing embodiments, wherein the supporting structure is disposed at a side of the flexible display panel.

The present disclosure also provides a manufacturing method of a supporting structure. The supporting structure includes at least a first bendable region, and a bending axis corresponding to the first bendable region extends in a first direction. The manufacturing method of the supporting structure includes: configuring the first bendable region to include a plurality of first primary bending regions and a plurality of first deformation compensation regions, where the plurality of first primary bending regions and the plurality of first deformation compensation regions are alternately arranged in the first direction; forming a plurality of first primary strip-shaped holes on each of the plurality of primary bending regions, where the plurality of first primary strip-shaped holes are arranged in an array and extend in the first direction; and forming a plurality of groups of first hollowed-out patterns on each of the plurality of first deformation compensation regions, where the plurality of groups of first hollowed-out patterns are arranged in an array, and each have a plurality of hollowed-out holes, where shapes of at least two of the plurality of hollowed-out holes are different, and extending directions of at least two of the plurality of hollowed-out holes are different.

The present disclosure provides a supporting structure may be disposed at a side of a flexible display panel in order to provide a certain support for the flexible display panel, so as to improve flatness of the flexible display panel and enhance impact resistance and bending resistance of the flexible display panel. The supporting structure includes a first bendable region, and the first bendable region includes a plurality of first primary bending regions and a plurality of first deformation compensation regions. Since at least two hollowed-out holes included in the first hollowed-out patterns of the first deformation compensation region have different shapes or different extending directions, the first bendable region has not only first primary strip-shaped holes, but holes with extending directions or shapes different from the first primary strip-shaped holes. These holes can appropriately alleviate the deformation amount of the first bendable region of the supporting structure in the non-bending direction, so that when the flexible display panel with the supporting structure is bent in the second direction, stresses in the non-bending direction applied on the bendable region of the flexible display panel can be reduced.

The display device provided by the present disclosure supports a flexible display panel via a supporting structure, which can improve reliability and stability of the products.

It should be understood that the above general description and the following detailed description are merely illustrative and explanatory, and thereby should not be construed as limiting the present disclosure.

BRIEF DESCRIPTION OF THE DRAWINGS

The accompanying drawings are incorporated in and constitute one part of the specification, show the embodiments of the present disclosure, and are intended to explain the principle of the present disclosure together with the description. Understandably, the drawings as described below are only exemplary, based on which the other drawings may be obtained by the person skilled in the art without any creative work.

DETAILED DESCRIPTION

Figure 1:
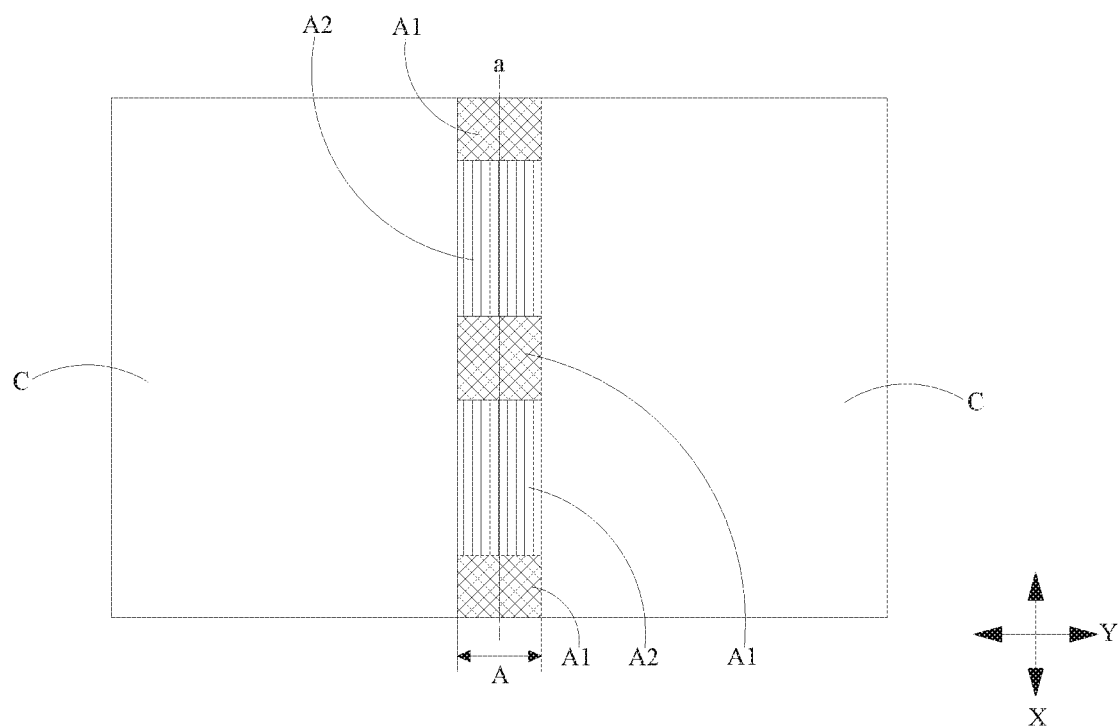
FIG. 1 is a schematic plan view of a supporting structure according to one or more embodiments of the present disclosure.

Now, the exemplary embodiments will be described more fully with reference to the accompanying drawings. However, the exemplary embodiments can be embodied in a variety of forms and should not be construed as limiting the embodiments set forth herein. Instead, these embodiments are provided so that the present disclosure will be thorough and complete, and the concepts of the exemplary embodiments will be fully given to those skilled in the art. The same reference numerals denote the same or similar structures in the drawings, and thus their detailed descriptions will be omitted.

The relative words, such as "upper" and "lower", as used herein, are directed to describe a relative relationship between one component and another component of an icon. These words are used herein for convenience only, for example, according to the direction of the illustrative examples as shown in the figures. It should be understood that if the device is turned upside down, the component indicated as being the "upper" side would become the component on the "lower" side. When one structure is "on" another structure, it is possible to indicate that the structure is integrally formed on the other structure, or one structure is "directly" disposed on the other structure, or one structure is "indirectly" disposed on the other structure through a further structure.

The terms such as "a", "an", "the", and "said" are used to indicate the presence of one or more elements, components, etc. The terms "comprise", "include", "have", "contain", and their variants are intended to be inclusive, and mean there may be additional elements, components, etc., in addition to the listed elements, components, etc.

The present disclosure provides a supporting structure that can be applied to a flexible display panel. Specifically, the supporting structure may be a flat plate structure that can be disposed at one side of the flexible display panel to provide a certain support for the flexible display panel, such that flatness of the flexible display panel can be improved and impact resistance and bending resistance of the flexible display panel can be enhanced.

For example, the supporting structure may be disposed at a back surface of the flexible display panel, where the back surface refers to a surface disposed opposite to a display surface of the flexible display panel; however, it is not limited thereto. The supporting structure may also be disposed at the display surface of the flexible display panel, and at this time, the supporting structure is required to be transparent, so that the normal display cannot be affected while the supporting structure provides support for the flexible display panel. In addition, when the supporting structure is disposed at the display surface of the flexible display panel, the supporting structure can also meet requirements of touch control.

It should be understood that, in order to satisfy supporting performance of the supporting structure 1, the supporting structure 1 may be made of materials with a certain thickness and rigidity, such as metal materials; however, it is not limited thereto.

The supporting structure has a certain thickness and rigidity, thereby leading to a poor bending performance, which is disadvantageous when meeting requirements of a smaller bending radius and when dispersing stress generated during bending, such that it easily results in such circumstances that the structure of the flexible display panel is damaged under the action of the stress, and the displaying performance further decreases.

In order to improve this situation, as shown in FIG. 1, at least a first bendable region A may be disposed on the supporting structure, and a bending axis a corresponding to the first bendable region A extends in a first direction X (i.e., an axial direction of the bending axis a is the first direction X). The first bendable region A may be patterned to reduce rigidity of the first bendable region A, so that the supporting structure can match with a smaller bending radius. It should be understood that, the first bendable region A of the supporting structure needs to be opposite to the first bendable region of the flexible display panel. When the first bendable region of the flexible display panel is bent, the first bendable region A of the supporting structure may also be bent along with the first bendable region of the flexible display panel.

It should be noted that, as shown in FIG. 1, the supporting structure may include not only the first bendable region A, but also fixed regions C located at two opposite sides of the first bendable region A in the second direction Y, and it is worth to explain that the second direction Y intersects with the first direction X. Optionally, the second direction Y is orthogonal to the first direction X. The first bendable region A can be bent in the second direction Y. When the first bendable region A is bent in the second direction Y, the fixed region C does not affect the bending effect of the first bendable region A. It should be understood that the fixed regions C of the supporting structure need to be opposite to the fixed regions of the flexible display panel, and during the process of bending the flexible display panel with the supporting structure in the second direction Y, the fixed regions C need to be fixed, to facilitate for bending the first bendable region A or maintaining a bending state of the first bendable region A.

In addition, it should be understood that, in order to ensure supporting stability of the supporting structure, it is required that the fixed regions C of the supporting structure has a sufficiently large rigidity, wherein the rigidity of the fixed regions C is greater than the rigidity of the first bendable region A. In order to make the rigidity of the fixed regions C sufficiently large, the fixed regions C may not be patterned in the embodiment of the present disclosure, however, it is not limited thereto, and the fixed regions C may be patterned as long as the rigidity of the fixed regions C can satisfy the supporting performance.

Further, in order to improve deformability of the first bendable region A, the embodiment of the present disclosure may perform an open-hole patterning process on the first bendable region A, that is, the first bendable region A is opened with through holes. Optionally, the through holes are long-strip-shaped holes extending in the first direction X, that is, a length direction of the long-strip-shaped holes is the first direction X. It should be understood that the long-strip-shaped holes may be rectangular or obround, and the term "obround" means that a formation having a body with a rectangular center and semicircular ends.

However, when the first bendable region A is bent, the long-strip-shaped holes may be deformed, that is, the long-strip-shaped holes may contract in the first direction X and expand in the second direction Y. If the entire first bendable region A is only opened with the long-strip-shaped holes extending in the first direction X, large stresses are generated in the first bendable region A in the non-bending direction (mainly, in the first direction X) such that the flexible display panel is easily damaged under the action of the stresses, when the flexible display panel amounted with the supporting structure is bent in the second direction Y.

Figure 2:
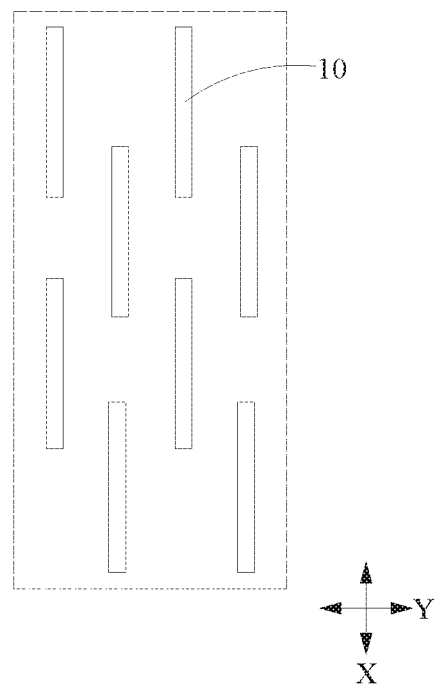
FIG. 2 is a schematic plan view of a first primary bending region of a first bendable region in a supporting structure according to one or more embodiments of the present disclosure.

Based on this, the first bendable region A of the supporting structure is divided into parts in the embodiment of the present disclosure. As shown in FIG. 1, the first bendable region A of the supporting structure has a plurality of first primary bending regions A2 and a plurality of first deformation compensation regions A1, and the first primary bending regions A2 and the first deformation compensation regions A1 are alternately arranged in the first direction X. As shown in FIG. 2, the first primary bending region A2 includes a plurality of first primary strip-shaped holes 10 arranged in an array; the first primary strip-shaped holes 10 are the aforementioned long-strip-shaped holes and extend in the first direction X. The first deformation compensation region A1 includes a plurality of groups of first hollowed-out patterns arranged in an array (referring to the pattern in the bold dotted line frame in FIGS. 3 to 8), and each group of the first hollowed-out patterns is formed by combining a plurality of hollowed-out holes. Shapes or extending directions of at least two of the plurality of hollowed-out holes are different.

In the embodiments of the present disclosure, since at least two hollowed-out holes included in the first hollowed-out patterns of the first deformation compensation region A1 have different shapes or different extending directions, the first bendable region A has not only the first primary strip-shaped holes 10, but also the holes with the extending directions or the shapes different from the first primary strip-shaped holes 10. These holes can appropriately relieve a deformation amount of the first bendable region A of the supporting structure in the non-bending direction, so that when the flexible display panel amounted with the supporting structure is bent in the second direction Y, the stresses applied on the bendable region of the flexible display panel in the non-bending direction can be reduced, and thereby avoid the circumstance of damaging the flexible display panel.

In addition, depending on that the first deformation compensation regions A1 and the first primary bending regions A2 are alternately arranged in the first direction X, the stresses applied to the parts of the first bendable region A can be properly balanced, such that the structural stability of the supporting structure and the flexible display panel can be ensured, and damage of the supporting structure and the flexible display panel can be avoided.

Optionally, a sum of areas of the plurality of first deformation compensation regions A1 is smaller than a sum of areas of the plurality of first primary bending regions A2, in this way, the deformation amount of the first bendable region A of the supporting structure in the second direction Y can be ensured, and the deformation amount of the first bendable region A of the supporting structure in the second direction Y can be adapted to the deformation amount of the flexible display panel in the second direction Y, so that when the flexible display panel with the supporting structure is bent in the second direction Y, the stresses in the non-bending direction applied on the bending region of the flexible display panel can be reduced, and thus damage of the flexible display panel can be avoided.

It should be noted that the areas of the plurality of first deformation compensation regions A1 may be different, and the areas of the plurality of first primary bending regions A2 may also be different, which may be determined according to specific conditions.

The adjacent first primary strip-shaped holes 10 in the second direction Y of the plurality of first primary strip-shaped holes 10 in the first primary bending region A2 are staggered; in this way, the bending performance at the parts of the first bendable region A can be ensured such that the first bendable region A of the supporting structure can match with the smaller bending radius.

The first hollowed-out patterns of the first deformation compensation regions A1 will be described in detail with reference to the accompanying drawings.

Figure 3:
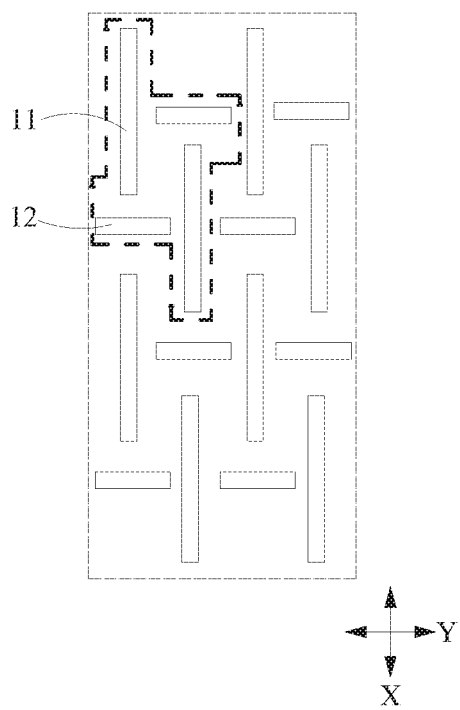
FIG. 3 is a schematic plan view of a first deformation compensation region according to one or more embodiments of the present disclosure.

In one or more embodiments of the present disclosure, for example, as shown in FIG. 3, the plurality of hollowed-out holes in the first hollowed-out patterns may include a first hollowed-out group and a second hollowed-out group that are spaced apart in the first direction X, and each of the first hollowed-out group and the second hollowed-out group includes a plurality of first hollowed-out holes 11 and a plurality of second hollowed-out holes 12 that are spaced apart in the second direction Y. The first hollowed-out holes 11 and the second hollowed-out holes 12 are long-strip-shaped. The first hollowed-out holes 11 extend in the first direction X, and the second hollowed-out holes 12 extend in the second direction Y.

The deformation amount of the first bendable region A of the supporting structure in the bending direction can be ensured by providing the first hollowed-out holes 11, and the deformation amount of the first bendable region A of the supporting structure in the non-bending direction can be properly relieved by providing the second hollowed-out holes 12, so that when the flexible display panel with the supporting structure is bent in the second direction Y, the stresses in the non-bending direction applied on the bending region of the flexible display panel can be reduced, and thereby damage of the flexible display panel can be avoided.

For example, a size of the first hollowed-out holes 11 in the first direction X is greater than or equal to a size of the second hollowed-out holes 12 in the second direction Y, so that the deformation amount of the first bendable region A of the supporting structure in the bending direction can be ensured while the deformation amount of the first bendable region A of the supporting structure in the non-bending direction can be properly relieved, and the bending performance of the first bendable region A can be improved.

Further, the shape and the size of the first hollowed-out hole 11 may be consistent with the shape and the size of the first primary strip-shaped hole 10 of the first primary bending region A2, to reduce design difficulty of the patterning process of the supporting structure, and thus reduce the cost.

The first hollowed-out holes 11 in the first hollowed-out group and the first hollowed-out holes 11 in the second hollowed-out group are staggered, and the second hollowed-out holes 12 in the first hollowed-out group and the second hollowed-out holes 12 in the second hollowed-out group are staggered. Also, the second hollowed-out holes 12 in the first hollowed-out group are opposite to the first hollowed-out holes 11 in the second hollowed-out group, and the second hollowed-out holes 12 in the second hollowed-out group are opposite to the first hollowed-out holes 11 in the first hollowed-out group. In this way, the stresses applied at the parts of the first deformation compensation region A1 can be properly balanced.

Figure 4:
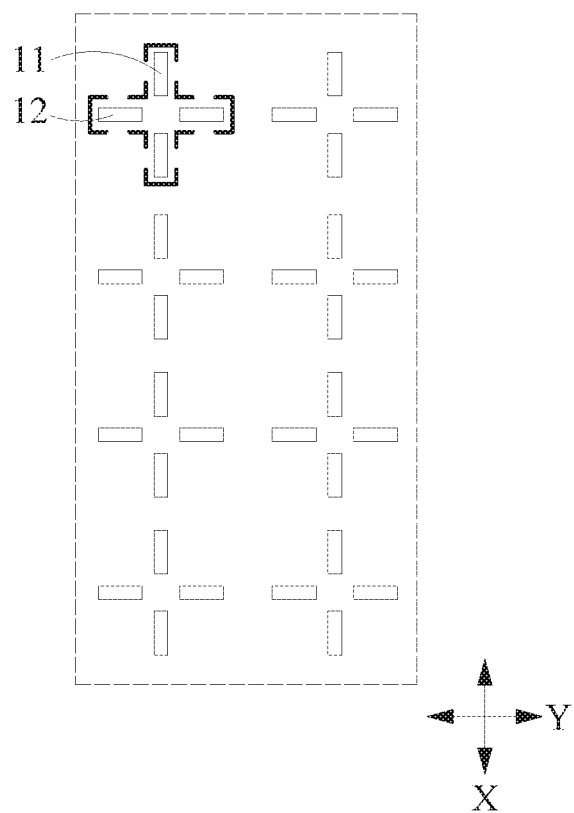
FIG. 4 is a schematic plan view of a first deformation compensation region according to one or more embodiments of the present disclosure.

In one or more embodiments of the present disclosure, for example, as shown in FIG. 4, the plurality of hollowed-out holes in the first hollowed-out pattern may include a first hollowed-out group and a second hollowed-out group. The first hollowed-out group may include two first hollowed-out holes 11 that are spaced apart and opposite to each other in the first direction X, and the second hollowed-out group may include two second hollowed-out holes 12 that are spaced apart and opposite to each other in the second direction Y. Optionally, the first hollowed-out hole 11 and the second hollowed-out hole 12 are long-strip-shaped. The first hollowed-out holes 11 extend in the first direction X, and the second hollowed-out holes 12 extend in the second direction Y.

The deformation amount of the first bendable region A of the supporting structure in the bending direction can be ensured by providing the first hollowed-out holes 11, and the deformation amount of the first bendable region A of the supporting structure in the non-bending direction can be properly relieved by providing the second hollowed-out holes 12, so that when the flexible display panel amounted with the supporting structure is bent in the second direction Y, the stresses applied on the bending region of the flexible display panel in the non-bending direction can be reduced, and thus damage of the flexible display panel can be avoided.

Two first hollowed-out holes 11 in the first hollowed-out group are symmetrically disposed with respect to a center of the first hollowed-out group; and two second hollowed-out holes 12 in the second hollowed-out group are symmetrically disposed with respect to a center of the second hollowed-out group. In addition, both the center of the first hollowed-out group and the center of the second hollowed-out group are coincided with the center of the first hollowed-out pattern. Further, the first hollowed-out holes 11, the second hollowed-out holes 12, and the first primary strip-shaped holes 10 may be consistent in the shape and the size, to reduce design difficulty of the patterning process of the first deformation compensation region A1, and thus reduce the cost.

Figure 5:
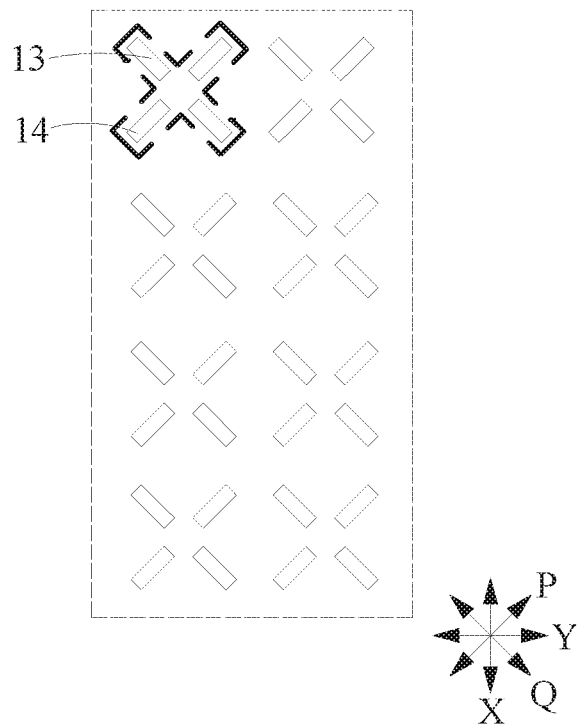
FIG. 5 is a schematic plan view of a first deformation compensation region according to one or more embodiments of the present disclosure.

In one or more embodiments of the present disclosure, for example, as shown in FIG. 5, the plurality of hollowed-out holes in the first hollowed-out pattern include a third hollowed-out group and a fourth hollowed-out group. The third hollowed-out group includes two third hollowed-out holes 13 that are spaced apart and opposite to each other in the third direction Q, and the two third hollowed-out holes 13 in the third hollowed-out group are symmetrically disposed with respect to a center of the third hollowed-out group. The fourth hollowed-out group includes two fourth hollowed-out holes 14 that are spaced apart and opposite to each other in the fourth direction P, and the two fourth hollowed-out holes 14 in the fourth hollowed-out group are symmetrically disposed with respect to a center of the fourth hollowed-out group. The center of the third hollowed-out group and the center of the fourth hollowed-out group are coincided with the center of the hollowed-out pattern. The third hollowed-out hole 13 and the fourth hollowed-out hole 14 are long-strip-shaped. The third hollowed-out holes 13 extend in the third direction Q, and the fourth hollowed-out holes 14 extend in the fourth direction P. It should be noted that the third direction Q intersects with the first direction X and the second direction Y, the fourth direction P intersects with the first direction X and the second direction Y, and the fourth direction P is orthogonal to the third direction Q.

The third hollowed-out holes 13 and the fourth hollowed-out holes 14 are provided to ensure the deformation amount of the first bendable region A of the supporting structure in the bending direction and also appropriately relieve the deformation amount of the first bendable region A of the supporting structure in the non-bending direction, so that when the flexible display panel with the supporting structure is bent in the second direction Y, the stresses applied on the bendable region of the flexible display panel in the non-bending direction can be reduced, and thus the damage of the flexible display panel can be avoided.

Further, the third hollowed-out holes 13, the fourth hollowed-out holes 14 and the first primary strip-shaped holes 10 may be consistent in the shape and the size, to reduce design difficulty of the patterning process of the first deformation compensation region A1, and thus reduce the cost.

Figure 6:
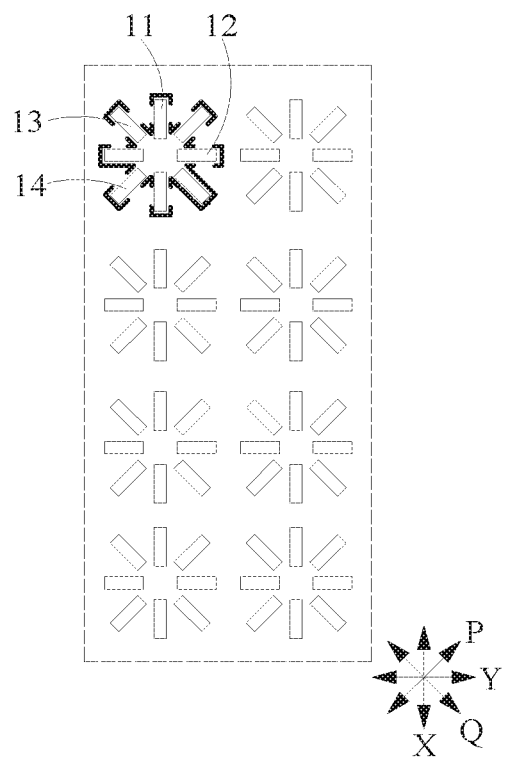
FIG. 6 is a schematic plan view of a first deformation compensation region according to one or more embodiments of the present disclosure.

In one or more embodiments of the present disclosure, for example, as shown in FIG. 6, the plurality of hollowed-out holes in the first hollowed-out pattern may include not only the first hollowed-out group and the second hollowed-out group mentioned in the second embodiment, but also the third hollowed-out group and the fourth hollowed-out group as mentioned in the third embodiment, that is, the first hollowed-out pattern may be composed of two first hollowed-out holes 11 spaced apart and opposite to each other in the first direction X, two second hollowed-out holes 12 spaced apart and opposite to each other in the second direction Y, two third hollowed-out holes 13 spaced apart and opposite to each other in the third direction Q, and two fourth hollowed-out holes 14 spaced apart and opposite to each other in the fourth direction P.

As the first hollowed-out group, the second hollowed-out group, the third hollowed-out group and the fourth hollowed-out group have been described in detail in the second embodiment and the third embodiment, the details will not be repeated in this embodiment.

Figure 7:
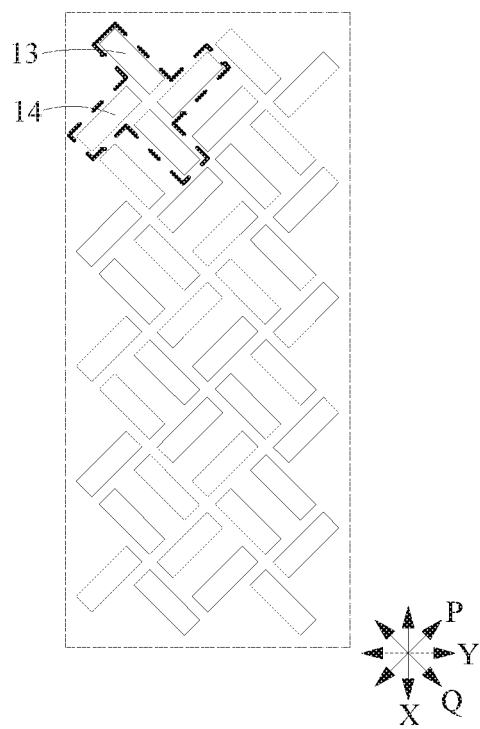
FIG. 7 is a schematic plan view of a first deformation compensation region according to one or more embodiments of the present disclosure.

In one or more embodiments of the present disclosure, for example, as shown in FIG. 7, the plurality of hollowed-out holes in the first hollowed-out patterns may include a third hollowed-out group and a fourth hollowed-out group that are spaced apart in the third direction Q. The third hollowed-out group and the fourth hollowed-out group respectively include third hollowed-out holes 13 and fourth hollowed-out holes 14 that are spaced apart in the fourth direction P. The third hollowed-out hole 13 and the fourth hollowed-out hole 14 are long-strip-shaped. The third hollowed-out holes 13 extend in the third direction Q and the fourth hollowed-out holes 14 extend in the fourth direction P.

In this embodiment, third hollowed-out holes 13 and fourth hollowed-out holes 14 are provided to ensure the deformation amount of the first bendable region A of the supporting structure in the bending direction and appropriately relieve the deformation amount of the first bendable region A of the supporting structure in the non-bending direction, so that when the flexible display panel with the supporting structure is bent in the second direction Y, the stresses applied on the bendable region of the flexible display panel in the non-bending direction can be reduced, and thus the damage of the flexible display panel can be avoided.

Optionally, the third hollowed-out holes 13 in the third hollowed-out group and the third hollowed-out holes 13 in the fourth hollowed-out group are staggered, and the fourth hollowed-out holes 14 in the third hollowed-out group and the fourth hollowed-out holes 14 in the fourth hollowed-out group are staggered. The fourth hollowed-out holes 14 in the third hollowed-out group are opposite to the third hollowed-out holes 13 in the fourth hollowed-out group, and the fourth hollowed-out holes 14 in the fourth hollowed-out group are opposite to the third hollowed-out holes 13 in the third hollowed-out group. In this way, the stresses applied at the parts of the first deformation compensation region A1 can be properly balanced.

Figure 8:
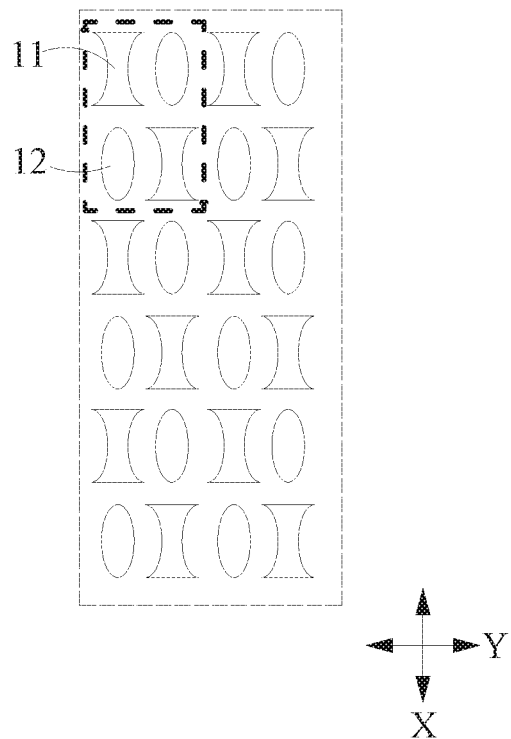
FIG. 8 is a schematic plan view of a first deformation compensation region according to one or more embodiments of the present disclosure.

In one or more embodiments of the present disclosure, for example, as shown in FIG. 8, the plurality of hollowed-out holes include a first hollowed-out group and a second hollowed-out group that are spaced apart in the first direction X, and each of the first hollowed-out group and the second hollowed-out group includes first hollowed-out holes 11 and second hollowed-out holes 12 which are spaced apart in the second direction Y. The first hollowed-out holes 11 in the first hollowed-out group and the first hollowed-out holes 11 in the second hollowed-out group are staggered, and the second hollowed-out holes 12 in the first hollowed-out group and the second hollowed-out holes 12 in the second hollowed-out group are staggered. The second hollowed-out holes 12 in the first hollowed-out group are opposite to the first hollowed-out holes 11 in the second hollowed-out group, and the second hollowed-out holes 12 in the second hollowed-out group are opposite to the first hollowed-out holes 11 in the first hollowed-out group.

The first hollowed-out holes 11 and the second hollowed-out holes 12 both extend in the first direction X. A size of the first hollowed-out hole 11 in the second direction Y gradually increases from a center of the first hollowed-out hole 11 to an edge of the first hollowed-out hole; and a size of the second hollowed-out hole 12 in the second direction Y gradually decreases from a center of the second hollowed-out hole 12 to an edge of the second hollowed-out hole.

The first hollowed-out hole 11 and the second hollowed-out hole 12 are provided as non-strip-shaped hole to ensure the deformation amount of the first bendable region A of the supporting structure in the bending direction and also appropriately relieve the deformation amount of the first bendable region A of the supporting structure in the non-bending direction, so that when the flexible display panel amounted with the supporting structure is bent in the second direction Y, the stresses applied on the bendable region of the flexible display panel in the non-bending direction can be reduced, and thus the damage of the flexible display panel can be avoided.

Optionally, the first hollowed-out hole 11 is formed by a first arc-shaped wall, a first plane wall, a second arc-shaped wall and a second plane wall sequentially connected from head to end. The first arc-shaped wall and the second arc-shaped wall are opposite to each other and symmetrically disposed in the first direction X, and the first plane wall and the second plane wall are opposite to each other and parallel to each other in the second direction Y. The second hollowed-out hole 12 is formed by a third arc-shaped wall and a fourth arc-shaped wall sequentially connected from head to end, the third arc-shaped wall and the fourth arc-shaped wall are opposite to each other and symmetrically disposed in the first direction X. The second hollowed-out hole 12 may be an elliptical hole, a long-axis direction of the elliptical hole is the first direction X, and a short-axis direction of the elliptical hole is the second direction Y.

Further, the second arc-shaped wall of the first hollowed-out hole 11 and the third arc-shaped wall of the second hollowed-out hole 12 in the first hollowed-out group are adjacent to each other, and have the same profile. The first arc-shaped wall of the first hollowed-out hole 11 and the fourth arc-shaped wall of the second hollowed-out hole 12 in the second hollowed-out group are adjacent to each other, and have the same profile.

A striped region is formed between the first hollowed-out group and the second hollowed-out group, in the case that the bending performance of the entire first bendable region A is not affected, the supporting strength at the first deformation compensation region A1 can be properly increased, so that capability of the flexible display panel recovering flatness after being bent can be ensured. In addition, an arc-shaped region is formed between the first hollowed-out hole 11 and the second hollowed-out hole 12 in the first hollowed-out group or the second hollowed-out group, so that when the display panel is bent, stress concentration at a connection position of the arc-shaped region and the striped region can be relieved by means of distortion of the arc-shaped region, the structural stability of the supporting structure and the flexible display panel can be ensured, and the damage of the supporting structure and the flexible display panel can be avoided.

It should be noted that the first hollowed-out pattern in the first deformation compensation region A1 is not limited to the patterns described in the foregoing six embodiments, and may be other patterns as long as the deformation amount of the first bendable region A of the supporting structure in the bending direction can be ensured, and the deformation amount of the first bendable region A of the supporting structure in the non-bending direction can also be properly relieved, which may be determined according to the specific conditions.

Figure 9:
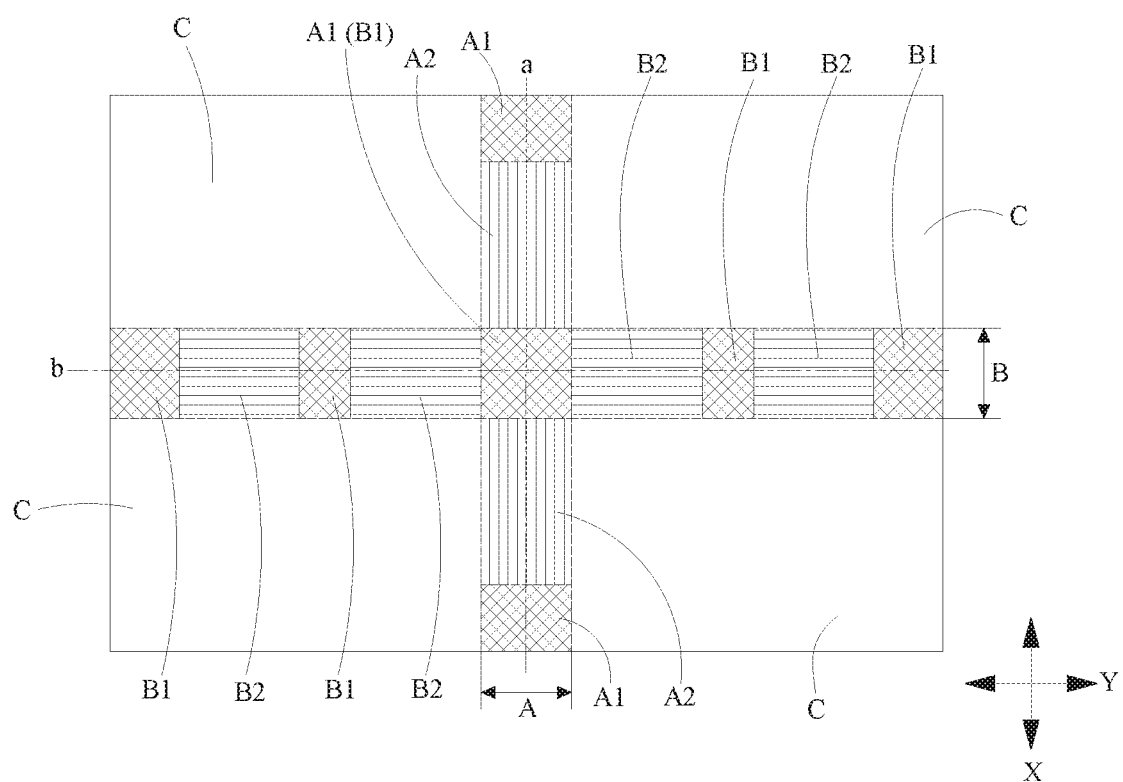
FIG. 9 is a schematic plan view of a supporting structure according to one or more embodiments of the present disclosure.

Further, as shown in FIG. 9, the supporting structure as above described may include not only the first bendable region A, but also the second bendable region B, a bending axis b of the second bendable region B extending in the second direction Y. The fixed regions C are disposed at two opposite sides of the second bendable region B in the first direction X. That is to say, the supporting structure can be bent not only in the first direction X but also in the second direction Y, so that the bending manners of the flexible display panel mounted with the supporting structure are increased.

The second bendable region B has a plurality of second primary bending regions B2 and a plurality of second deformation compensation regions, and the second primary bending regions B2 and the second deformation compensation regions B1 are alternately arranged in the second direction Y.

Specifically, the second primary bending region B2 may include a plurality of second primary strip-shaped holes arranged in an array. The second primary strip-shaped holes extend in the second direction Y, such that the bending performance of the second bendable region B can be ensured. It should be noted that the second primary strip-shaped hole and the first primary strip-shaped hole 10 are different mainly in the extending direction, and may be the same in other designs (for example, shape and size, etc.).

The first deformation compensation region A1 may include a plurality of groups of second hollowed-out patterns arranged in an array, and the second hollowed-out pattern is the same as the first hollowed-out pattern. Since there are hollowed-out holes with different shapes or extending directions in the first hollowed-out pattern, the second hollowed-out pattern is designed to be the same as the first hollowed-out pattern, which can reduce the design difficulty, and simultaneously, the second bendable region B not only has the second primary strip-shaped holes, but also has holes with different extending directions or shapes from the second primary strip-shaped holes, and these holes can appropriately relieve the deformation amount of the second bendable region B of the supporting structure in the non-bending direction, so that when the flexible display panel with the supporting structure is bent in the first direction X, the stresses applied on the bending region of the flexible display panel in the non-bending direction can be reduced, and thus the damage of the flexible display panel can be avoided.

Since the second hollowed-out pattern of the second deformation compensation region B1 in the second bendable region B is the same as the first hollowed-out pattern of the first deformation compensation region A1 in the first bendable region A, the specific pattern of the second hollowed-out pattern may refer to the patterns as described in the foregoing six embodiments, and the details will not be repeated herein.

In addition, it should be noted that, since the first hollowed-out pattern of the first deformation compensation region A1 is the same as the second hollowed-out pattern of the second deformation compensation region B1, the pattern at the overlapped portion of the first bendable region A and the second bendable region B can be designed as the first hollowed-out pattern (the second hollowed-out pattern) in the design process.

The present disclosure further provides a display device including a flexible display panel (not shown in the drawings) and the supporting structure as described in any of the foregoing embodiments. The supporting structure may be disposed at a side of the flexible display panel; for the specific relationship between the supporting structure and the flexible display panels, reference may be made to the content described in any of the foregoing embodiments, and the details will not be repeated herein. It should be noted that the first bendable region A of the supporting structure corresponds to the first bendable region A of the flexible display panel, and the fixed regions C of the supporting structure correspond to the fixed regions C of the flexible display panel. During the curling or bending process, the supporting structure and the flexible display panel may be configured as a whole.

For example, the flexible display panel may be an OLED (Organic Light-Emitting Diode) display panel, however it is not limited thereto, and may also be a liquid crystal display panel.

The specific type of the display device is not particularly limited, and may be any type of display devices commonly used in the art, for example, mobile devices such as liquid crystal displays, OLED displays, mobile phones, and wearable devices such as watches, VR devices, etc. Those skilled in the art can make a corresponding selection according to specific use requirements of the display device, which will not be repeated herein.

The present disclosure also provides a manufacturing method of a supporting structure. The supporting structure includes at least a first bendable region A, and a bending axis corresponding to the first bendable region A extends in a first direction, The manufacturing method of the supporting structure includes: configuring the first bendable region A to include a plurality of first primary bending regions A2 and a plurality of first deformation compensation regions A1, wherein the plurality of first primary bending regions A2 and the plurality of first deformation compensation regions A1 are alternately arranged in the first direction; forming a plurality of first primary strip-shaped holes 10 on each of the plurality of primary bending regions A2, wherein the plurality of first primary strip-shaped holes 10 are arranged in an array, and extend in the first direction; and forming a plurality of groups of first hollowed-out patterns on each of the plurality of first deformation compensation regions, wherein the plurality of groups of first hollowed-out patterns are arranged in an array, and each have a plurality of hollowed-out holes, wherein shapes of at least two of the plurality of hollowed-out holes are different, and extending directions of at least two of the plurality of hollowed-out holes are different.

Other embodiments of the present disclosure will be apparent to those skilled in the art for consideration of the specification and practice of the disclosure herein, or the embodiments mentioned in this application can also be combined. The present disclosure is intended to cover any variations, uses, or adaptations of the present disclosure following the general principles thereof and including such departures from the present disclosure as come within known or customary practice in the art. The specification and embodiments are to be regarded as illustrative only, with a real scope and spirit of the present disclosure being indicated by following appended claims.

What is claimed is:

1. A supporting structure applied to a flexible display panel, the supporting structure comprising:
    a first bendable region, wherein a bending axis corresponding to the first bendable region extends in a first direction, wherein:

the first bendable region has a plurality of first primary bending regions and a plurality of first deformation compensation regions, and the plurality of first primary bending regions and the plurality of first deformation compensation regions are alternately arranged in the first direction;

each of the plurality of first primary bending regions comprises a plurality of first primary strip-shaped holes arranged in an array, and the first primary strip-shaped holes extend in the first direction; and each of the plurality of first deformation compensation regions comprises a plurality of groups of first hollowed-out patterns arranged in an array, each group of first hollowed-out patterns comprising a plurality of hollowed-out holes, wherein shapes of at least two of the plurality of hollowed-out holes are different and extending directions of at least two of the plurality of hollowed-out holes are different.

2. The supporting structure according to claim 1, wherein:
the first primary strip-shaped holes adjacent to each other of the plurality of first primary strip-shaped holes in a second direction are staggered; and
the second direction is orthogonal to the first direction.

3. The supporting structure according to claim 2, wherein:
the plurality of hollowed-out holes comprise a first hollowed-out group and a second hollowed-out group which are spaced apart in the first direction, and the first hollowed-out group and the second hollowed-out group respectively comprise first hollowed-out holes and second hollowed-out holes spaced apart in the second direction; and
both the first hollowed-out hole and the second hollowed-out hole are long-strip-shaped, the first hollowed-out holes extend in the first direction, and the second hollowed-out holes extend in the second direction.

4. The supporting structure according to claim 3, wherein:
the first hollowed-out holes in the first hollowed-out group and the first hollowed-out holes in the second hollowed-out group are staggered, and the second hollowed-out holes in the first hollowed-out group and the second hollowed-out holes in the second hollowed-out group are staggered; and
the second hollowed-out holes in the first hollowed-out group are opposite to the first hollowed-out holes in the second hollowed-out group, and the second hollowed-out holes in the second hollowed-out group are opposite to the first hollowed-out holes in the first hollowed-out group.

5. The supporting structure according to claim 3, wherein a size of the first hollowed-out hole in the first direction is larger than or equal to a size of the second hollowed-out hole in the second direction.

6. The supporting structure according to claim 2, wherein:
the plurality of hollowed-out holes comprise a first hollowed-out group and a second hollowed-out group;
the first hollowed-out group comprises two first hollowed-out holes spaced apart and opposite to each other in the first direction, and the two first hollowed-out holes in the first hollowed-out group are symmetrically disposed with respect to a center of the first hollowed-out group;
the second hollowed-out group comprises two second hollowed-out holes spaced apart and opposite to each other in the second direction; the two second hollowed-out holes in the second hollowed-out group are symmetrically disposed with respect to a center of the second hollowed-out group;

both the center of the first hollowed-out group and the center of the second hollowed-out group are coincided with a center of the first hollowed-out pattern; and
the first hollowed-out holes and the second hollowed-out holes are long-strip-shaped, the first hollowed-out holes extend in the first direction, and the second hollowed-out holes extend in the second direction.

7. The supporting structure according to claim 2, wherein:
the plurality of hollowed-out holes comprise a third hollowed-out group and a fourth hollowed-out group;
the third hollowed-out group comprises two third hollowed-out holes spaced apart and opposite to each other in a third direction, and the two third hollowed-out holes in the third hollowed-out group are symmetrically disposed with respect to a center of the third hollowed-out group;
the fourth hollowed-out group comprises two fourth hollowed-out holes spaced apart and opposite to each other in a fourth direction; the two fourth hollowed-out holes in the fourth hollowed-out group are symmetrically disposed with respect to a center of the fourth hollowed-out group;
the center of the third hollowed-out group and the center of the fourth hollowed-out group are coincided with the center of the hollowed-out pattern;
both the third hollowed-out holes and the fourth hollowed-out holes are long-strip-shaped, the third hollowed-out holes extend in the third direction, and the fourth hollowed-out holes extend in the fourth direction; and
the third direction intersects with the first direction and the second direction, the fourth direction intersects with the first direction and the second direction, and the fourth direction is orthogonal to the third direction.

8. The supporting structure according to claim 6, wherein:
the plurality of hollowed-out holes comprise a third hollowed-out group and a fourth hollowed-out group;
the third hollowed-out group comprises two third hollowed-out holes spaced apart and opposite to each other in a third direction, and the two third hollowed-out holes in the third hollowed-out group are symmetrically disposed with respect to a center of the third hollowed-out group;
the fourth hollowed-out group comprises two fourth hollowed-out holes spaced apart and opposite to each other in a fourth direction; the two fourth hollowed-out holes in the fourth hollowed-out group are symmetrically disposed with respect to a center of the fourth hollowed-out group;
the center of the third hollowed-out group and the center of the fourth hollowed-out group are coincided with the center of the hollowed-out pattern;
both the third hollowed-out holes and the fourth hollowed-out holes are long-strip-shaped, the third hollowed-out holes extend in the third direction, and the fourth hollowed-out holes extend in the fourth direction; and
the third direction intersects with the first direction and the second direction, the fourth direction intersects with the first direction and the second direction, and the fourth direction is orthogonal to the third direction.

9. The supporting structure according to claim 2, wherein:
the plurality of hollowed-out holes comprise a third hollowed-out group and a fourth hollowed-out group spaced apart in a third direction, and the third hollowed-out group and the fourth hollowed-out group respectively comprise third hollowed-out holes and fourth hollowed-out holes spaced apart in a fourth direction;

the third hollowed-out holes in the third hollowed-out group and the third hollowed-out holes in the fourth hollowed-out group are staggered, and the fourth hollowed-out holes in the third hollowed-out group and the fourth hollowed-out holes in the fourth hollowed-out group are staggered;

the fourth hollowed-out holes in the third hollowed-out group are opposite to the third hollowed-out holes in the fourth hollowed-out group, and the fourth hollowed-out holes in the fourth hollowed-out group are opposite to the third hollowed-out holes in the third hollowed-out group;

both the third hollowed-out holes and the fourth hollowed-out holes are long-strip-shaped; and the third hollowed out holes extend in the third direction and the fourth hollowed out holes extend in the fourth direction.

10. The supporting structure according to claim 2, wherein:

the plurality of hollowed-out holes comprise a first hollowed-out group and a second hollowed-out group spaced apart in the first direction, and the first hollowed-out group and the second hollowed-out group respectively comprise first hollowed-out holes and second hollowed-out holes spaced apart in the second direction;

the first hollowed-out holes in the first hollowed-out group and the first hollowed-out holes in the second hollowed-out group are staggered, and the second hollowed-out holes in the first hollowed-out group and the second hollowed-out holes in the second hollowed-out group are staggered;

the second hollowed-out holes in the first hollowed-out group are opposite to the first hollowed-out holes in the second hollowed-out group, and the second hollowed-out holes in the second hollowed-out group are opposite to the first hollowed-out holes in the first hollowed-out group;

both the first hollowed-out holes and the second hollowed-out holes extend in the first direction;

a size of the first hollowed-out hole in the second direction gradually increases from a center of the first hollowed-out hole to an edge of the first hollowed-out hole; and a size of the second hollowed-out hole in the second direction gradually decreases from a center of the second hollowed-out hole to an edge of the second hollowed-out hole.

11. The supporting structure according to claim 10, wherein:

the first hollowed-out hole is formed by a first arc-shaped wall, a first plane wall, a second arc-shaped wall and a second plane wall sequentially connected to one another end to end, the first arc-shaped wall and the second arc-shaped wall are opposite to each other and symmetrically disposed in the first direction, and the first plane wall and the second plane wall are opposite to and parallel to each other in the second direction;

the second hollowed-out hole is formed by a third arc-shaped wall and a fourth arc-shaped wall sequentially connected with each other end to end, and the third arc-shaped wall and the fourth arc-shaped wall are opposite to each other in the first direction and are symmetrically disposed;

the second arc-shaped wall of the first hollowed-out hole and the third arc-shaped wall of the second hollowed-out hole in the first hollowed-out group are adjacent to each other, and have the same profile; and the first arc-shaped wall of the first hollowed-out hole and the fourth arc-shaped wall of the second hollowed-out hole in the second hollowed-out group are adjacent to each other, and have the same profile.

12. The supporting structure according to claim 2, further comprising a second bendable region, a bending axis of the second bendable region extending in the second direction, the second bendable region having a plurality of second primary bending regions and a plurality of second deformation compensation regions, the second primary bending regions and the second deformation compensation regions being alternately arranged in the second direction;

wherein the second primary bending region comprises a plurality of second primary strip-shaped holes arranged in an array, and the second primary strip-shaped holes extend in the second direction; and wherein each of the plurality of first deformation compensation regions comprises a plurality of groups of second hollowed-out patterns arranged in an array, and the second hollowed-out patterns are the same as the first hollowed-out patterns.

13. The supporting structure according to claim 12, wherein:

a sum of areas of the plurality of first deformation compensation regions is smaller than a sum of areas of the plurality of first primary bending regions; and a sum of areas of the second deformation compensation regions is smaller than a sum of areas of the second primary bending regions.

14. A display device, comprising:

a flexible display panel; and a supporting structure disposed at a side of the flexible display panel, the supporting structure comprising a first bendable region, wherein a bending axis corresponding to the first bendable region extends in a first direction, wherein:

the first bendable region has a plurality of first primary bending regions and a plurality of first deformation compensation regions, and the plurality of first primary bending regions and the plurality of first deformation compensation regions are alternately arranged in the first direction;

each of the plurality of first primary bending regions comprises a plurality of first primary strip-shaped holes arranged in an array, and the first primary strip-shaped holes extend in the first direction; and each of the plurality of first deformation compensation regions comprises a plurality of groups of first hollowed-out patterns arranged in an array, each group of first hollowed-out patterns comprising a plurality of hollowed-out holes, wherein shapes of at least two of the plurality of hollowed-out holes are different and extending directions of at least two of the plurality of hollowed-out holes are different.

15. A manufacturing method of a supporting structure, the supporting structure comprising at least a first bendable region and a bending axis corresponding to the first bendable region extending in a first direction, wherein the manufacturing method of the supporting structure comprises:

configuring the first bendable region to comprise a plurality of first primary bending regions and a plurality of first deformation compensation regions, wherein the plurality of first primary bending regions and the plurality of first deformation compensation regions are alternately arranged in the first direction;

forming a plurality of first primary strip-shaped holes on each of the plurality of primary bending regions, wherein the plurality of first primary strip-shaped holes are arranged in an array and extend in the first direction; and forming a plurality of groups of first hollowed-out patterns on each of the plurality of first deformation compensation regions, wherein the plurality of groups of first hollowed-out patterns are arranged in an array, and each have a plurality of hollowed-out holes;

wherein shapes of at least two of the plurality of hollowed-out holes are different, and extending directions of at least two of the plurality of hollowed-out holes are different.

* * * * *